United States Patent
Roy

(12) United States Patent (10) Patent No.: US 7,701,030 B2
Roy (45) Date of Patent: Apr. 20, 2010

(54) PINNED PHOTODIODE WITH HIGH STORAGE CAPACITY, METHOD OF MANUFACTURE AND IMAGE SENSOR INCORPORATING SAME

(75) Inventor: Francois Roy, Seyssins (FR)

(73) Assignee: STMicroelectronics SA, Montrouge (FR)

(*) Notice: Subject to any disclaimer, the term of this patent is extended or adjusted under 35 U.S.C. 154(b) by 98 days.

(21) Appl. No.: 11/963,939

(22) Filed: Dec. 24, 2007

(65) Prior Publication Data

US 2008/0150071 A1    Jun. 26, 2008

(30) Foreign Application Priority Data

Dec. 26, 2006    (FR) .................................. 06 11350

(51) Int. Cl.
*H01L 31/103*    (2006.01)
*H01L 31/18*    (2006.01)

(52) U.S. Cl. .............................. 257/463; 257/E31.054; 257/E31.084; 438/57; 438/75

(58) Field of Classification Search ........................ None
See application file for complete search history.

(56) References Cited

U.S. PATENT DOCUMENTS

| | | | | |
|---|---|---|---|---|
| 5,446,297 | A * | 8/1995 | Lee ............................. | 257/223 |
| 6,489,643 | B1 * | 12/2002 | Lee et al. ..................... | 257/292 |
| 6,521,925 | B1 * | 2/2003 | Mori et al. ................... | 257/292 |
| 7,154,137 | B2 * | 12/2006 | Nozaki ......................... | 257/292 |
| 7,238,977 | B2 * | 7/2007 | Hong et al. ................... | 257/292 |
| 7,417,273 | B2 * | 8/2008 | Inoue et al. ................... | 257/292 |
| 2005/0064613 | A1 * | 3/2005 | Takeuchi et al. .............. | 438/24 |
| 2006/0103747 | A1 * | 5/2006 | Rhodes ......................... | 348/300 |

* cited by examiner

*Primary Examiner*—Thanh V Pham
*Assistant Examiner*—Andres Munoz
(74) *Attorney, Agent, or Firm*—Hogan & Hartson LLP

(57) ABSTRACT

In a photodiode formed by a region of a first type inside a region of a second type, of a semiconductor substrate, the region of the first type includes a first zone including a dopant of the first type having a first concentration and a first depth. The region of the first type also has a second zone adjacent to the first zone in the dopant of the first type has a second concentration higher than the first concentration and a second depth smaller than the first depth. A method for making such a diode is also disclosed.

9 Claims, 1 Drawing Sheet

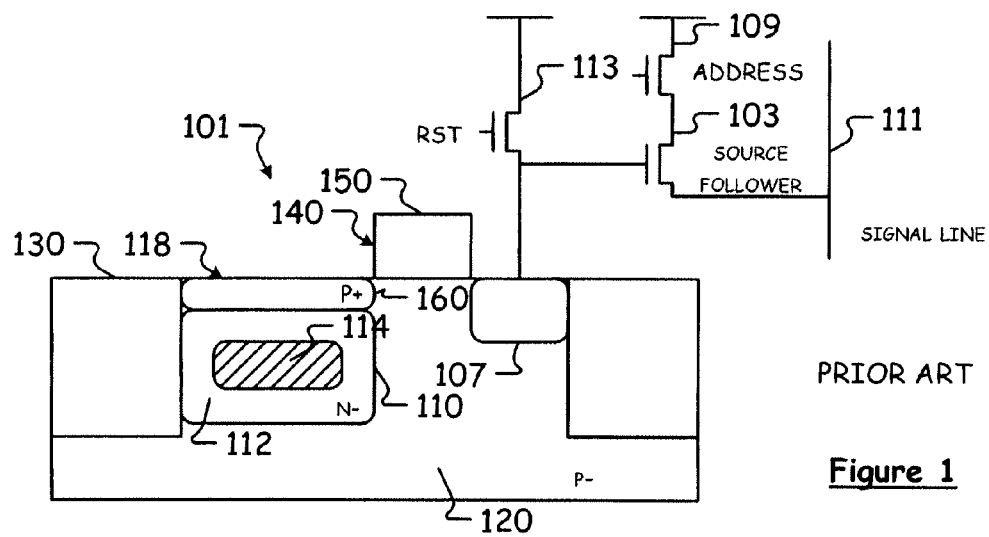
PRIOR ART
Figure 1
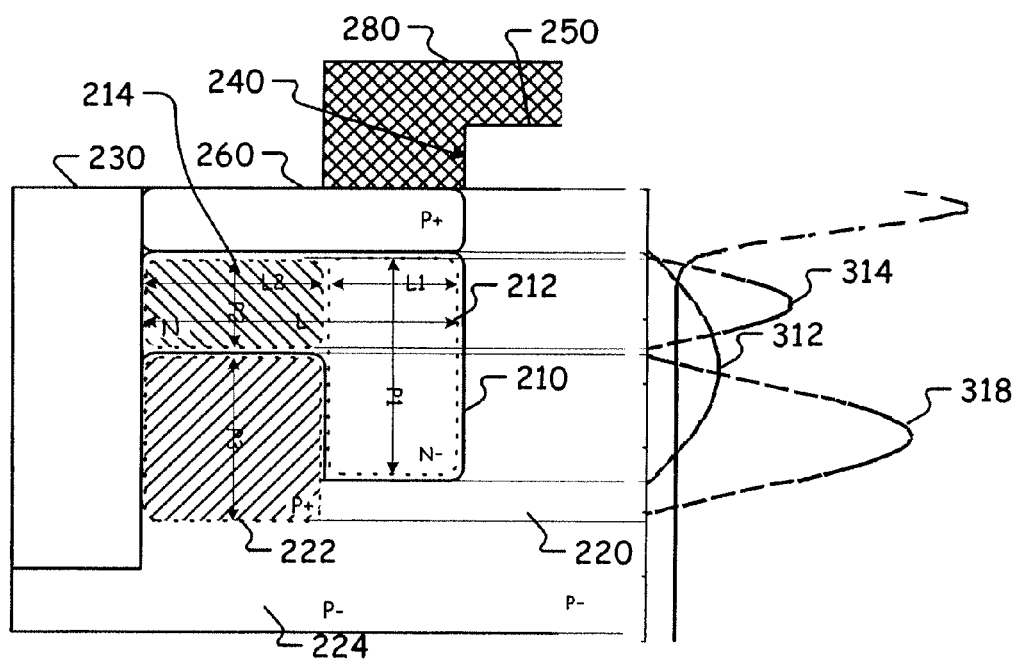
Figure 2
Figure 3

PINNED PHOTODIODE WITH HIGH STORAGE CAPACITY, METHOD OF MANUFACTURE AND IMAGE SENSOR INCORPORATING SAME

RELATED APPLICATION

The present application claims priority of French Patent Application No. 0611350 filed Dec. 26, 2006, which is incorporated herein in its entirety by this reference.

FIELD OF THE INVENTION

The invention relates to a photodiode and an associated method of manufacture. The photodiode is formed in a region of a first type inside a region of a second type of a semiconductor substrate. The first type is, for example, of an N type and the second type is, for example, of a P type, or the inverse. The invention is useful especially but not solely for making image sensors such as CCD (charge-coupled device) sensors or CMOS sensors.

BACKGROUND

FIG. 1 shows an image sensor known especially from the document D1 (US 2006/0103747). The sensor has a photodiode 101, a transfer transistor having a transfer gate 150, a floating node 107, and a means 103, 109, 111, 113 of reading the floating node. The photodiode 101 has an N− type accumulation region 110 (called a "shallow region" in D1) in a P− type region 120 of a substrate or directly on a P− substrate, and a P+ type very shallow pinning region 160 (called a "pinning layer" in D1) situated above the shallow region. The regions 110 and 160 are limited on one side by an isolation region 130 and on the other side by a vertical plane passing through a flank 140 of the gate 150. The interface between the region 160 and the region 110 forms a first PN junction and the interface between the region 110 and the substrate forms a second PN junction.

The working of such a diode comprises an accumulation phase and a transfer phase. During the accumulation phase, a ground potential is applied to the P region 120 (substrate) and to the P+ region 160 and a reverse bias potential Vd is applied to the N− region 110. When photons strike an upper surface 118 of the diode, electron-hole pairs are generated in the diode, more specifically in the regions 160, 110, 112, 120, and the electrons here are stored in the N region 110. During the transfer phase, the gate 150 of the transfer transistor is turned on and the electrons generated by photo-emission are transferred to the floating node 107 whose content can then be read by the reading means.

The depth of the regions 110, 160 and the N, P dopant concentrations in these regions are chosen so that, when the charge transfer is complete, the gate of the transfer transistor being on (the potential Vp is applied to the N type region 110), the space charge zones of the two diodes meet. Thus, during the accumulation phase, the gate of the transfer transistor being off, no majority carrier can be extracted from the region 110. Such a diode is called a pinned diode or fully depleted diode.

One problem with a diode according to FIG. 1 is its limited storage capacity.

The document D1 proposes to increase the storage capacity of such a diode by making the N− region by implantation of two N− type dopants having different coefficients of diffusion and different densities of concentration (FIG. 2 of D1), the implantation zone of the first dopant 112 surrounding the implantation zone of the second dopant 114.

The invention also seeks to increase the storage capacity of a prior art diode by proposing an alternative to the solution of D1.

SUMMARY OF THE INVENTION

To this end, the invention proposes a device comprising a first photodiode, and a second photodiode juxtaposed the first photodiode and having a doping profile reinforced relative to a doping profile of the first photodiode.

A pinching of the second diode is reinforced relative to a pinching of the first diode.

The device may be formed by a first region (210) of a first type above a second region (220) of a second type formed on a semiconductor substrate.

Said first region (210) comprises a first zone (212) comprising a dopant of the first type with a concentration (C1) and having a first depth (P1). The first zone forms the accumulation zone of the first diode.

According to the invention, said first region (210) also has a second zone (214) adjacent to the first zone (212), comprising the dopant of the first type with a second concentration (C2) higher than the first concentration (C1) and having a second depth (P2) smaller than the first depth (P1). the second zone (214) forms the accumulation zone of the second diode.

The reinforcement of the doping profile of the second diode relative to the doping profile of the first diode is traduced by a second concentration in the second zone higher than the first concentration in the first zone.

In other words, in the first region (210), the dopant concentration is increased locally in the second zone (214) relative to the concentration in the first zone (210). This enables the increasing of the storage capacity of the diode.

Also, the limitation of the depth of the second zone relative to the depth of the first zone fixes the value of the reverse bias potential of the second diode at an appropriate value so that, during operation, the diode is fully pinned at the end of a charge transfer and during the accumulation phase.

The second region (220) may comprise a third zone (222) adjacent to the first zone (212) and extending beneath the second zone (214) on a third depth (P3), and comprising a dopant of the second type. This third zone enables to limit the depth of the second zone at the second depth smaller than the first depth of the first zone.

The local increase of the concentration in the second zone and the addition of the third zone are a solution to reinforce the pinching of the second diode.

The invention also relates to a method for making a device in a semiconductor substrate, said device being formed in a first region of a first type (210) above a region of a second type (220). The method especially comprises a first step of formation of the first region (210) of the first type by the addition of a dopant of the first type to a first concentration (C1) on an initial length (L) and on a first depth (P1) of the second region (220) of the second type.

The method of the invention also comprises a second step of local increase in the first concentration (C1) on a second length (L2) smaller than the initial length (L) and on a second depth (P2) smaller than the first depth (P1). Thus a reinforced doping profile (higher dopant concentration) is obtained in the second zone (214) having a size defined by the second length (L2) and the second depth (P2). This second step enables the storage capacity of the device to be increased, the second zone forming the accumulation zone of the second diode.

The method of the invention also comprises a third step of pinching the first region on the second length (L2) with the second depth (P2). This third step enables the reverse bias potential of the diode to be adjusted to an appropriate value so that, during operation, the diode is completely pinned at the end of the charge transfer.

The invention finally relates to an image sensor comprising a device as described here above.

BRIEF DESCRIPTION OF THE DRAWINGS

The invention will be understood more clearly and other features and advantages will appear from the following description of an exemplary embodiment of a device according to the invention and an associated method. The description is to be read with reference to the appended drawing, in which:

FIG. 1, described above is section along an (X, Z) plane of an image sensor comprising a prior art diode, FIG. 2 is a section along the (X, Z) plane of a device according to the present invention.

FIG. 3 is an exemplary doping profile of a second of two diodes of a preferred embodiment of the present invention.

The axes X, Y, Z are defined such that:

the upper surface of the substrate defines the plane (X, Y), the width of the different zones of the substrate being defined along the Y axis and the length of the different zones being defined along the X direction, the Z axis extends perpendicularly to the upper surface of the substrate, from the upper surface of the substrate toward the lower surface of the substrate, the depth of the different zones of the substrate being defined along the Z axis positively downwards, in the figures, the X axis extends horizontally from left to right, the Y axis extends perpendicularly towards the rear and the Y axis extends vertically downwards.

DETAILED DESCRIPTION OF PREFERRED EMBODIMENTS

Just like a known photodiode (FIG. 1), a device according to the invention is formed (FIG. 2) by a first region 210 of a first type above a second region 220 of a second type formed on a semiconductor substrate. The region 220 is, in practice, the substrate itself (the case of FIG. 2) or else a bulk feature of the second type in a substrate of the first type. In the example of FIG. 2, the regions 210, 220 are weakly doped. Furthermore, the first type is the N type and the second type is the P type. But the reverse condition is of course possible.

Just as in the case of a prior art diode, along the direction X parallel to an upper surface of the substrate, the region 210 has a total length L demarcated on a first side by an isolating region 230 (for example of the STI or Shallow Trench Isolation type) implanted in the substrate, and on a second side approximately by a vertical plane defined by a flank 240 of a gate 250, which is the gate of a transfer transistor. The device also has a pinning region 260 of a second P type having a very small thickness and extending above the region 210, on the surface of the substrate.

The first region 210 has a first zone 212 comprising a dopant of the first N type with a first concentration C1 and a first depth P1.

According to the invention, the first region 210 also has a second zone 214 adjacent to the first zone 212, comprising the dopant of the first type with a second concentration C2 greater than the first concentration C1 and a second depth P2 smaller then the first depth P1.

The first zone 212 extends over a first length L1. The second zone 214 extends over a second length L2. The total length L of the diode is equal to L1+L2. L2 is for example of the order of 0.2 to 4 times the first length L1 or, in other words, L2 is of the order of 20 to 80% of the total length L of the diode and L1 is of the order of 80 to 20% of the total length L. In the example of FIG. 2, L2 is substantially equal to the first length L1.

In the example of FIG. 2, the first length L1 is demarcated on one side by the second zone 214 and on another side by the vertical plane defined by the flank 240 of the gate 250, and the second length L2 is demarcated on one side by the isolating region 230 and on the other side by the first zone 212. In the device of FIG. 2, the first zone 212 (forming the accumulation zone of the first diode) is thus localized on the transfer gate 250 side, between the second zone 214 (forming the accumulation zone of the second diode) and the plane passing through the flank 240 of the gate 250. However, the reverse is also possible: the second zone 214, shallower and more highly doped than the first zone 212 may thus, in another example, be situated between the first zone 212 and the vertical plane defined by the flank 240 of the gate 250.

In the first zone 212, the first concentration C1 of N type dopant is of the order of 2 to $10.10^{12}$ cm$^{-2}$. In the second zone 214, the second concentration C2 of N type dopant is of the order of 0.5 to 3 times the concentration C1, with C2 being of the order of 4 to $20.10^{12}$ cm$^{-2}$.

The second region 220 of the second type includes a third zone 222 adjacent to the first zone and extending beneath the second zone 214 on a third depth P3, and comprising a dopant of the second type (P+ in the example) with a third concentration C3. The depth P3 is chosen for example to be greater than P1-P2, but P3 can also be chosen to be equal to or less than P1-P2. The third zone enables to reinforce the pinching of the second diode in limiting the depth P2 of the second zone and in increasing the concentration in dopant in the region located above the accumulation zone of the second diode.

The second region 220 also has a fourth zone 224 which, in practice, is the unmodified part of the substrate or initial second region 220. The region 224 thus extends beneath the third zone 222, beneath the first zone 212, and beside the zone 212 beneath the gate 250. The region 224 has a dopant of the second type (P− in the example) with a fourth concentration C4, which is a weak concentration, of the order of 0.01 to 1 time the third concentration C3.

As compared with the prior art diode according to FIG. 1, in a device according to the invention, the first region 210 has been modified as follows:

The concentration in dopant of the first N type is reinforced in the zone 214 as compared with the concentration in the zone 212: C2>C1 the depth has been limited in the zone 214 as compared with the depth in the zone 212 (the region 210 is said to be pinched in the zone 212): P2<P1

The increase in the concentration in the zone 214 provides for a local increase in the capacity of the two PN junctions (the junctions are more abrupt between the zones 260 and 212 on the one hand and between the zones 224 and 214 on the other hand). This increases the capacity of storage of electric charges in the diode by 30% to 50% in choosing appropriate dopant concentrations. The limitation of the depth of the region 210 beneath the zone 214 enables modification of the reverse bias potential Vp of the second diode so that this potential remains compliant with the constraints of charge transfer from the diode to the floating node (not shown in FIG. 2) of the image sensor in which the device is likely to be used.

The choice of the depth P2 thus makes it possible to fix the potential Vp for which the device is fully depleted at the end of a charge transfer.

The modifications of the region 210 are preferably limited to a length L2 on the isolating region 230 side, i.e. on the side opposite the transfer transistor, and are not extended throughout the length L of the diode. This makes it possible not to modify the zone 212 in the vicinity of the gate 250. The conditions of transfer of the charges from the first region 210 to the floating node (not shown) are thus unchanged. Thus, in an electrical point of view, the device of the invention is equivalent to two juxtaposed diodes.

This enables the maintaining, in the vicinity of the junction between the zones 212 and 224, of a means to retrieve the electrons likely to be generated in the zone 224 at a substantial depth by absorption of high-energy photons such as red photons.

The invention also relates to a method for making a diode as described here above.

Just as in the case of a prior-art method, such as the one liable to be used to make the diode of FIG. 1, a method of the invention comprises a first step for adding a dopant of the first type (N in the example) with a first concentration C1 on an initial length L and on a first depth P1 of a region 220 of the second type (P in the example). The region 220 may be a substrate (cf FIG. 2) or else a bulk feature of the second type in a substrate of the first type.

A dopant of the first type, for example phosphorus or arsenic, is chosen with a concentration C1 of the order of 2 to $10.10^{12}$ cm$^{-2}$, for example $5.10^{12}$ cm$^{-2}$. The curve 312 (FIG. 3) shows the doping profile associated with this first step. The dopant of the second type for its part is boron or indium for example.

The first step is done preferably after prior art preliminary steps of lateral isolation to form the isolation region 230 and of the making of the gates 250. The lateral isolation is for example done according to a shallow trench isolation technique. The first step may be performed by means of a method of self-alignment on the isolating region 230 and the gates 250.

At the end of the first step, a first region 210 of a first type is thus obtained with a substantially parallelepiped shape, a length L and depth P1.

The method of the invention also comprises a second step for locally increasing the first concentration C1 on a second length L2 smaller than the initial length L and on the second depth P2 smaller than the first depth P1.

The local increase in the first concentration C1 is done by the addition of a dopant of the first type on the length L2 and on the depth P2. The dopant of the first type may be the same as the one used during the preceding step but not necessarily so. Thus, after increasing the concentration, we obtain a zone 214 with a concentration C2, a length L2 and the depth P2 in the region of the first type formed previously. We choose, for example, for this step a concentration of dopant of the order of 2 to $10.10^{12}$ cm$^{-2}$, for example of the order of $10.10^{12}$ cm$^{-2}$. Thus, in the zone 214, we obtain a concentration C2 of the order of 2 to $20.10^{12}$ cm$^{-2}$, for example of the order of $15.10^{12}$ cm$^{-2}$ giving C2 approximately equal to 1 to 5 times C1. The curve 314 (FIG. 3) shows the doping profile associated with this second step.

The method of the invention also comprises a third step of pinching or narrowing the first region 210 on the second length L2 at the second depth P2. In other words, the region 210 is limited to the vicinity of the zone 214 for which the concentration had been previously increased.

The pinching of the first region 210 is obtained by the addition of a dopant of the second P type on the second length L2 and on the third depth P3 extending beneath the second depth P2. The second type of doping may be the same as the one used for the doping of the second region 220 (or substrate) but not necessarily so. A dopant concentration of the order of 5 to $50.10^{12}$ cm$^{-2}$ is chosen, for example of the order of $15.10^{12}$ cm$^{-2}$ is chosen and an energy value of implantation or diffusion is chosen so as to be sufficient to dope the zone with a depth P3 starting from the depth P2, i.e. the zone situated beneath the zone 214 where the concentration in dopant of the first N type was previously increased. In FIG. 3, the curve shows the doping profile associated with this third step, in the particular case where P3 is chosen to be greater than P1-P2. However P3 can also be chosen to be lower than or equal to P1-P2, and the doping profile would have to be adjusted accordingly.

After the second and third steps have been carried out, the region 210 of the first N type is limited to:

the zone 212, with a depth P1 and a length L1, containing dopants of the first type with a concentration C1, the zone 214, with a depth P2<P1 and a length L2 (L=L1+L2), containing dopants of the first type with the concentration C2>C1.

All the steps for adding dopant can be performed according to known techniques such as, for example, the technique of diffusion or the technique of ion implantation of dopants.

The second step and the third step necessitate a preliminary step for laying a mask 280 of protective resin partially lining the first region defined in the first step on the first length L1 starting from the gate 250. This mask thus protects the zone 212 during the second step and the third step, and defines the length L2 of the zones 214 and 224 modified during the second step and the third step. The mask 280 is removed after the second step and the third steps have been performed.

The method can be completed by known complementary steps for making spacers on the flanks of the gate 250, the making of metal contacts etc needed for finishing the diode or a sensor including the diode according to the invention.

Thus, as compared with the prior art method, the method of the invention has four additional steps: the laying of the mask of resin 280, the local increasing of the concentration in the region 214, the pinching of the zone 210 and the removal of the mask. These additional steps correspond to the superposition of a second diode (second zone 214) beside the first diode (first zone 212).

What is claimed is:

1. A device located between an isolating region and a transfer gate of a charge transfer transistor, comprising:

a first photodiode having a doping profile; and a second photodiode having a doping profile reinforced relative to the doping profile of the first photodiode, wherein said device is formed by a first region of a first conductivity type above a second region of a second conductivity type formed on a semiconductor substrate, said first region comprising (a) a first zone comprising a dopant of the first conductivity type with a first concentration and having a first depth and (b) a second zone adjacent to the first zone, comprising the dopant of the first conductivity type with a second concentration higher than the first concentration and having a second depth smaller than the first depth, wherein the first photodiode comprises at least the first zone of the first region and the second photodiode comprises at least the second zone of the first region.

2. A device according to the claim 1, wherein a pinching of the second photodiode is reinforced relative to a pinching of the first photodiode.

3. A device according to claim 1, wherein the first zone extends over a first length and wherein the second zone extends over a second length of the order of 0.2 to 4 times the first length.

4. A device according to claim 3, wherein the first length is substantially equal to the second length.

5. A device according to claim 1, wherein the second concentration is of the order of 0.5 to 3 times the first concentration.

6. A device according to claim 1, wherein the second region comprises a third zone adjacent to the first zone and positioned underneath the second zone on a third depth, and comprising a dopant of the second conductivity type.

7. A device according to claim 1, wherein the first conductivity type is an N type and wherein the second conductivity type is a P type.

8. A device according to claim 1 wherein the first zone is situated between the second zone and the transfer gate.

9. A device according to claim 1 wherein the second zone is situated between the first zone and the transfer gate.

* * * * *